United States Patent [19]
Ajika et al.

[11] Patent Number: 5,218,219
[45] Date of Patent: Jun. 8, 1993

[54] SEMICONDUCTOR MEMORY DEVICE HAVING A PERIPHERAL WALL AT THE BOUNDARY REGION OF A MEMORY CELL ARRAY REGION AND A PERIPHERAL CIRCUIT REGION

[75] Inventors: Natsuo Ajika; Hideaki Arima; Kaoru Motonami; Atsushi Hachisuka; Tomonori Okudaira, all of Hyogo, Japan

[73] Assignee: Mitsubishi Denki Kabushiki Kaisha, Tokyo, Japan

[21] Appl. No.: 678,872

[22] Filed: Apr. 4, 1991

[30] Foreign Application Priority Data

Apr. 27, 1990 [JP] Japan .................. 2-113633

[51] Int. Cl.[5] .......................... H01L 27/108
[52] U.S. Cl. .................. 257/309; 257/306; 257/752
[58] Field of Search .......... 357/23.6, 71, 53; 257/752, 306, 307, 308, 309

[56] References Cited

U.S. PATENT DOCUMENTS

| | | | |
|---|---|---|---|
| 4,958,318 | 9/1990 | Harari | 357/23.6 |
| 4,994,893 | 2/1991 | Ozaki et al. | 357/23.6 |
| 5,047,817 | 9/1991 | Wakamiya et al. | 357/23.6 |

FOREIGN PATENT DOCUMENTS 0414227  2/1991  European Pat. Off.
3918924 12/1989  Fed. Rep. of Germany.

Primary Examiner—William D. Larkins
Attorney, Agent, or Firm—Lowe, Price, LeBlanc & Becker

[57] ABSTRACT

A dynamic random access memory (DRAM) is disclosed that can effectively prevent the formation of steps in the boundary region of a memory cell array 101 and a peripheral circuit 102, even in high integrated devices. This DRAM includes a double peripheral wall 20 of peripheral walls 20a and 20b at the boundary region of the memory cell array 101 and the peripheral circuit 102 of a P type silicon substrate 1, extending vertically upwards from the P type silicon substrate 1. The upper surfaces of the devices formed on the memory cell array and the peripheral circuit 102 in forming devices on the memory cell array 101 and the peripheral circuit 102 are substantially planarized, by virtue of the double peripheral wall 20, to effectively prevent steps from being generated in the boundary region of the memory cell array 101 and the peripheral circuit 102, even in high integrated devices.

8 Claims, 10 Drawing Sheets

SEMICONDUCTOR MEMORY DEVICE HAVING A PERIPHERAL WALL AT THE BOUNDARY REGION OF A MEMORY CELL ARRAY REGION AND A PERIPHERAL CIRCUIT REGION

BACKGROUND OF THE INVENTION

1. Field of the Invention

The present invention relates to semiconductor memory devices, and more particularly, to a dynamic random access memory (DRAM) structure and a method of manufacturing thereof.

2. Description of the Background Art

In recent years, the demand for semiconductor memory devices are rapidly increasing due to the remarkable spread of information equipment of computers. Semiconductor memory devices having large functional storage capacity and capable of high speed operation are required. Accordingly, developments in techniques are carried out regarding high density integration, quick response, and high reliability of semiconductor memory devices.

Figure 6:
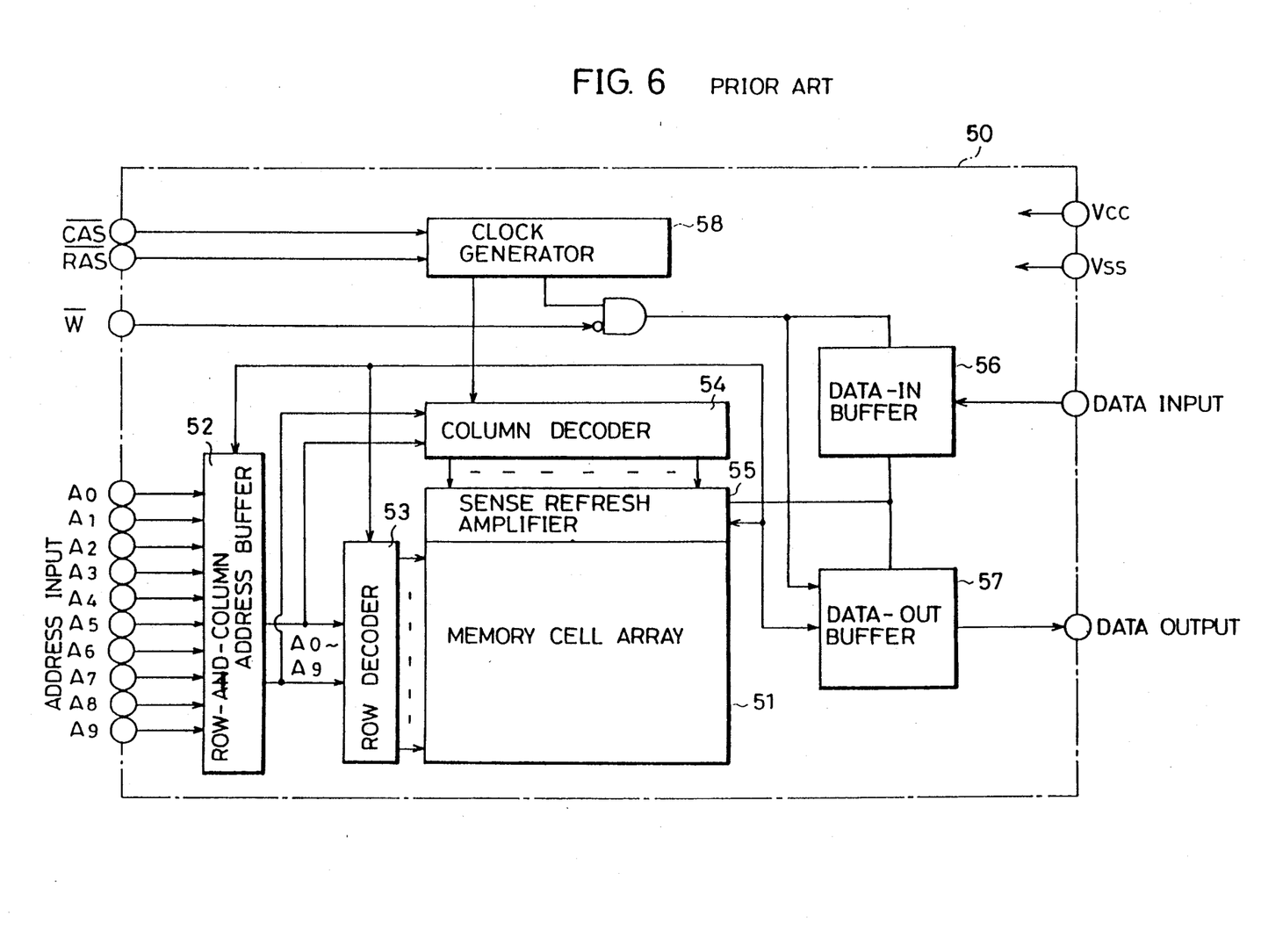
FIG. 6 is a block diagram of a conventional DRAM structure.

A DRAM in semiconductor memory devices is known as being capable of random input/output of storage information. A DRAM comprises a memory cell array which is the storage region for storing a plurality of storage information, and a peripheral circuit required for input from and output to an external source. FIG. 6 is a block diagram showing a general DRAM structure. Referring to FIG. 6, a DRAM 50 comprises a memory cell array 51 for storing data signal of storage information, a row-and-column address buffer 52 for receiving external address signals to select memory cells forming a unit storage circuit, a row decoder 53 and a column decoder 54 for specifying a memory cell by decoding the address signal, a sense refresh amplifier 55 for amplifying and reading out the signal stored in the specified memory cell, a data-in buffer 56 and a data-out buffer 57 for data input/output, and a clock generator 58 for generating a clock signal.

The memory cell array 51 occupying a large area on the semiconductor chip has a plurality of memory cells for storing unit storage information arranged in a matrix manner. A one-transistor one-capacitor type memory cell is well known, implemented with one MOS transistor and one capacitor connected thereof. Such memory cells are widely used for large capacity DRAMs because of its simple structure contributing to the improvement in higher integration of the memory cell array.

Figure 7:
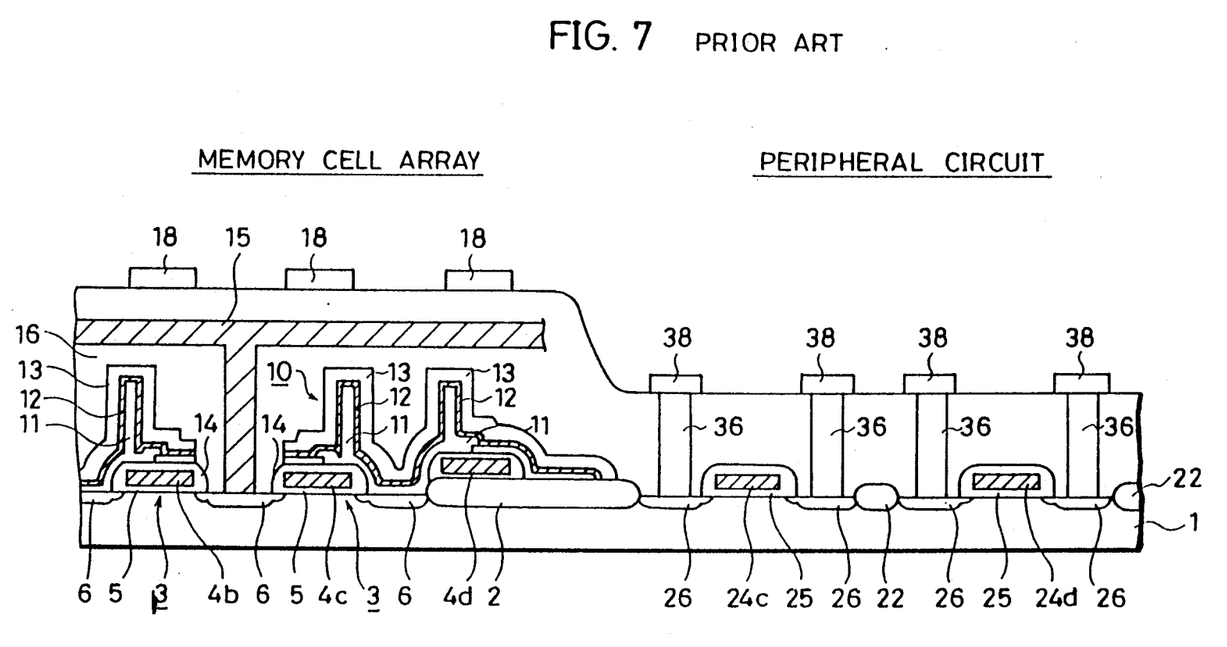
FIG. 7 is a sectional structure view of a conventional DRAM.

The memory cells of a DRAM can be classified into several types depending on the structure of the capacitor. A stacked type capacitor can have an increased capacitor capacitance through extension of the major portion of the capacitor to the gate electrode and over the field isolation film to increase the opposing area between electrodes of the capacitor. By virtue of this characteristic, a stacked type capacitor can ensure an enough capacitor capacitance even in the case devices are miniaturized by larger scale integration of the semiconductor device. The extensive usage of stacked type capacitors resulted from such larger scale integration of the semiconductor devices. Toward larger scale integration of semiconductor devices, development in stacked type capacitors are also in progress. A stacked type capacitor of a cylindrical type has been proposed to ensure constant capacitance even in the case where semiconductor devices are integrated in a more miniaturized manner. Such a capacitor is described in "Symposium on VLSI Techn." page 69 (1989). FIG. 7 is a sectional view of a DRAM employing a conventional stacked type capacitor of a cylindrical type. Referring to FIG. 7, the DRAM adopting a conventional stacked type capacitor of a cylindrical type comprises a memory cell array and a peripheral circuit. The memory cell array comprises one transfer gate transistor 3 and one capacitor 10. The transfer gate transistor 3 comprises a pair of source/drain regions 6 formed on the surface of a P type silicon substrate 1, and gate electrodes 4b and 4c formed on the surface of P type silicon substrate 1 between one pair of source/drain regions 6 with a gate insulating film 5 thereunder. The periphery of gate electrodes 4b and 4c are covered by an insulating film 14. A thick interlayer insulating film 16 is formed on the surface of silicon substrate 1 where transfer gate transistor 3 is formed. A capacitor 10 is implemented with a layered structure of a lower electrode (storage node) 11, a dielectric layer 12, and an upper electrode (cell plate) 13. One of source/drain regions 6 forming transfer gate transistor 3 is connected to a bit line 15. A wiring layer 18 is provided corresponding to gate electrodes 4b, 4c, and 4d. The peripheral circuit is implemented with two MOS transistors of identical conductivity type. That is to say, two pairs of source/drain regions 26 forming MOS transistors are provided on the P type silicon substrate. Gate electrodes 24c and 24d with a gate insulating film 25 thereunder are formed between one pair of source/drain regions 26. The MOS transistor formed on P type silicon substrate 1 is device-isolated by a field oxide film 22. Each of the source/drain regions 26 is connected to a wiring layer 38 via a contact layer 36.

A stacked type capacitor has been developed for ensuring constant capacitance where devices are miniaturized in accordance with the increased scale of integration of the semiconductor device. Such a capacitor manufactured by a conventional method has a sectional view of FIG. 7.

This cylindrical stacked type capacitor has the electrode formed vertically upwards from P type silicon substrate 1. There was a problem that a step is formed between the memory cell array and the peripheral circuit due to difference in height of the memory cell array and the peripheral circuit, after the formation process of the electrode. Such a stepped portion will lead to an inconvenience that the focus of the exposed light is offset at the stepped portion at the later photolithography processing. It was difficult to improve the patterning accuracy, with the problem that the processing accuracy could not be improved. There was also a problem that a residue not etched is formed at the stepped portion when etching is carried out. There was also a difficulty in the manufacturing process due to difference in depth between the contacts of the memory cell array and the peripheral circuit, when the contact is formed after the formation of a stacked type capacitor of the cylindrical type.

SUMMARY OF THE INVENTION

An object of the present invention is to efficiently prevent the formation of a step in the boundary region of a memory cell array and a peripheral circuit in a semiconductor memory device even of high integration.

Another object of the present invention is to fix the potential of the boundary region of a memory cell array region and a peripheral circuit region in a semiconductor memory device.

A further object of the present invention is to improve patterning accuracy, after the formation of a capacitor at the boundary region of a memory cell array region and a peripheral circuit region in the method of manufacturing a semiconductor memory device.

A still further object of the present invention is to eliminate etching residue in the etching process, after the formation of a capacitor at the boundary region of a memory cell array region and a peripheral circuit region in a method of manufacturing a semiconductor memory device.

According to one aspect of the present invention, a semiconductor memory device includes at least a memory cell array region and a peripheral circuit region formed on a semiconductor substrate, where a plurality of memory cells each having a capacitor and a transistor are formed in the memory cell array region of the semiconductor substrate. The transistor includes a pair of impurity regions formed on the surface of the semiconductor substrate and gate electrodes. The capacitor includes one electrode connected to one impurity region of the gate electrode and having a side wall extending in a vertical direction, and the other electrode arranged opposing the one electrode with a dielectric film therebetween. A plurality of transistors for peripheral circuits having a pair of impurity regions formed on the surface of the semiconductor substrate and a gate electrode is implemented in the peripheral circuit region of the semiconductor substrate. A conductor is formed at the boundary region of the memory cell array region and the peripheral circuit region of the semiconductor substrate. That conductor has a pair of standing walls extending in a vertical direction and arranged opposing each other, where at least one of the upper surface of the standing wall is located in a plane substantially identical with the upper surface of the side wall of one electrode of the capacitor.

In operation, a conductor extends in a vertical direction between the boundary region of the memory cell array region and the peripheral circuit region in the semiconductor substrate. The conductor has a pair of standing walls arranged opposing each other, with at least one upper surface of the standing wall located in a plane substantially identical with the upper surface of the side wall of one electrode of the capacitor. The upper surface of the devices formed on the memory cell array region and the peripheral circuit region are substantially planarized.

According to another aspect of the present invention, a method of manufacturing a semiconductor memory device comprises the steps of forming a first conductive layer convexly with an insulating film on a first device forming region, forming a second conductive layer on a second device forming region, wherein the upper surface thereof is substantially identical with the convex upper surface portion of the first conductive layer, and forming a pair of standing walls with a predetermined distance therebetween along the boundary region of the first device forming region and the second device forming region, extending vertically upwards from the main surface of the semiconductor substrate, having an upper surface substantially identical with the convex upper surface portion of the first conductive layer. An etch back film is formed having a thick portion and a thin portion of thickness all over the first and second device forming regions, with a stepped portion in the region between one pair of standing walls, so that the portion formed on the second device forming region is higher in height than the portion formed on the first device forming region. The convex upper surface portion of the first conductive layer is exposed by etch-backing the etch back film. The convex upper surface portion of the first conductive layer is removed, under a state where the second conductive layer still remains.

In operation, a first conductive layer is formed convexly on the first device forming region with an insulating film therebetween. A second conductive layer is formed on the second device forming region, wherein the upper surface thereof is substantially identical with the convex upper surface portion of the first device forming region. A pair of standing walls with a predetermined distance therebetween is formed along the boundary region of the first device forming region and the second device forming region, extending vertically upwards from the main surface of the semiconductor substrate, having an upper surface substantially the same as the convex upper surface portion of the first conductive layer. An etch back film is formed all over the first device forming region and the second device forming region, having a thick portion and a thin portion, with a stepped portion in the region enclosed by a pair of standing walls, so that the height of the portion formed on the second device forming region is higher than the portion formed on the first device forming region. The convex upper surface portion of the first conductive layer is exposed by etch-backing the etch back film. The convex upper surface portion of the first conductive layer is removed in a state where the second conductive layer remains. As a result, the insulating film formed beneath the second conductive layer is not reduced in removing the convex upper surface portion of the first conductive layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The following embodiments will be explained in detail with reference to the drawings.

Figure 1:
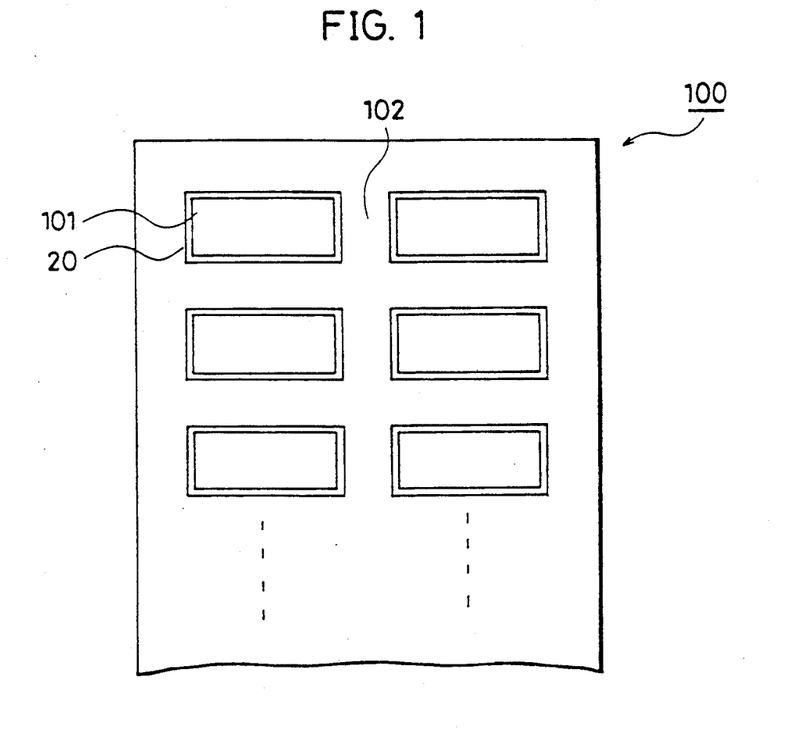
FIG. 1 is a plan view of the structure of a DRAM of an embodiment of the present invention.

Referring to FIG. 1, a DRAM 100 comprises a memory cell array 101 which is the storage region of data, and a peripheral circuit 102 performing operation such as applying data to or obtaining data from memory cell array 101. At the boundary region of memory cell array 101 and peripheral circuit 102, a double peripheral wall 20 is provided. The number of the allocated memory cell array corresponds to the storage capacity (for example, 64M-DRAM).

Figure 2:
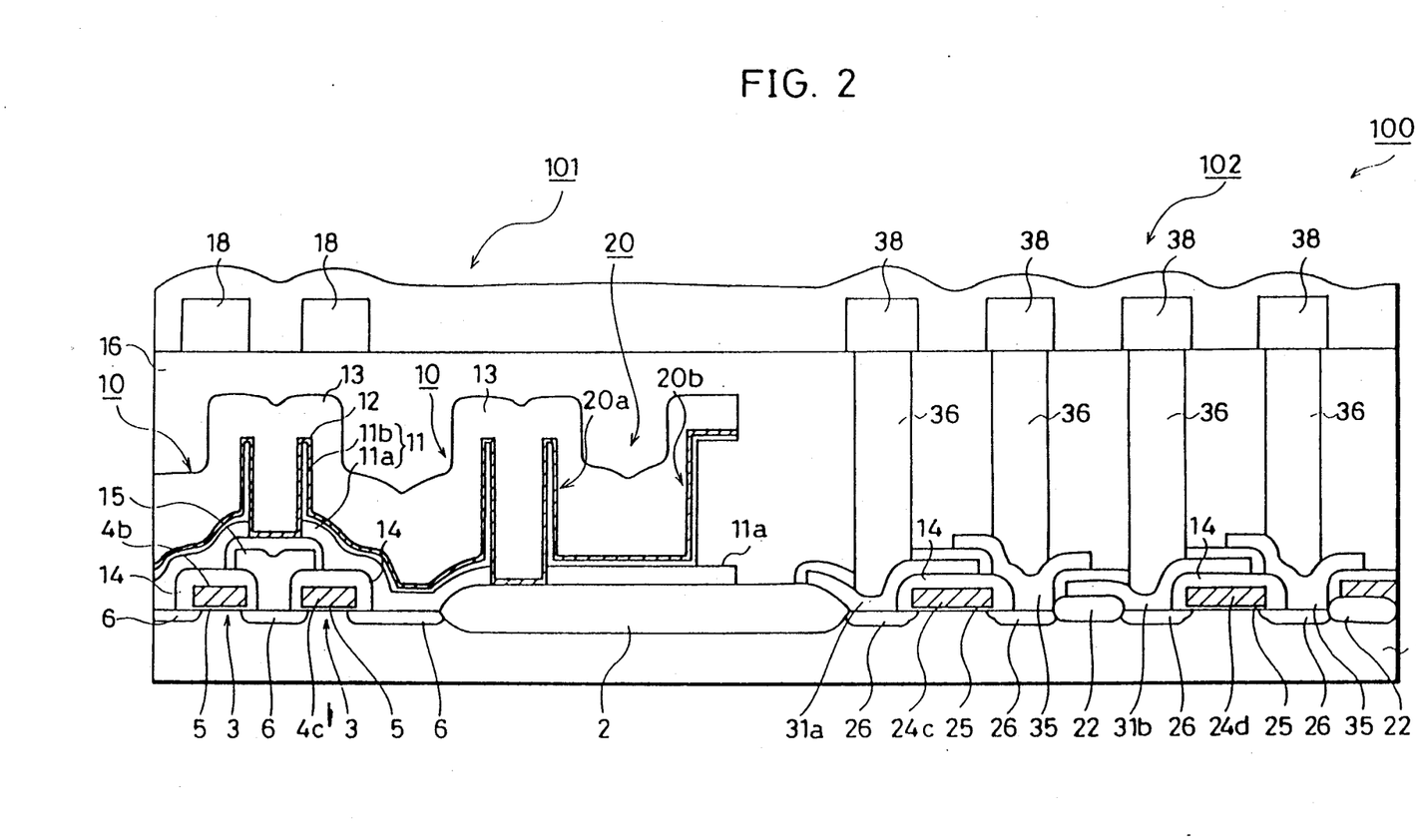
FIG. 2 is a sectional view of the DRAM of FIG. 1.

Referring to FIG. 2, DRAM 100 comprises memory cell array 101 and peripheral circuit 102, as mentioned above. Memory cell array 101 comprises one transfer gate transistor 3 and one capacitor 10. Transfer gate transistor 3 comprises a pair of source/drain regions 6 formed on the surface of P type silicon substrate 1, and gate electrodes (word lines) 4b and 4c formed on the surface of P type silicon substrate 1 between a pair of source/drain regions 6 with a gate insulating film 5 thereunder. The periphery of each of gate electrodes 4b and 4c is covered by an insulating film 14.

Capacitor 10 is implemented with a layered structure of a lower electrode (storage node) 11, a dielectric layer 12, and an upper electrode (cell plate) 13. Lower electrode 11 comprises a base 11a connected to source/drain regions 6 formed adjacent to field oxide film 2, and a standing wall 11b formed along the outer circumference of base 11a extending vertically upwards. Base 11a and standing wall 11b are formed integrally of a polycrystal silicon layer having impurities introduced. Dielectric layer 12 is formed on the surface of lower electrode 11. Dielectric layer 12 is formed to cover both sides of the inner side and the outer side of standing wall 11b of lower electrode 11. The standing wall 11b of lower electrode 11 forms the capacitance portion with both the inner and outer sides to effectively ensure constant capacitance when miniaturized. Dielectric layer 12 may comprise, for example, an oxide film, a nitride film, a composite film of an oxide film and a nitride film, a metal oxide film or the like. The surface of upper electrode 13 is covered by an interlayer insulating film 16. A wiring layer 18 of a predetermined configuration is formed on the surface of interlayer insulating film 16.

One of source/drain regions 6 of transfer gate transistor 3 is connected to a bit line 15. Bit line 15 is formed at a position lower than standing wall 11b and the main portion of base 11a of lower electrode 11. One of source/drain regions 6 of transfer gate transistor 3 extends to a region contacting bit line 15. Contact with bit line 15 is implemented with the connection of the extending source/drain regions 6 and bit line 15.

Peripheral circuit 102 has two MOS transistors formed of the same conductivity type. That is to say, source/drain regions 26 are formed on P type silicon substrate 1, corresponding to the number of the MOS transistors. The MOS transistors are isolated by field oxide film 22. Source/drain regions 26 are formed to connect conductive layers 31a and 35. A wiring layer 38 is formed above conductive layers 31a and 35 with a contact layer 36 therebetween. Gate electrodes 24c and 24d are formed between one pair of source/drain regions 26 with a gate insulating film 25 thereunder. An insulating film 14 is formed over each of gate electrodes 24c and 24d.

The boundary region of memory cell array 101 and peripheral circuit 102 is formed with a double peripheral wall 20. That is to say, peripheral walls 20a and 20b are formed above field oxide film 2 of P type silicon substrate 1, extending vertically upwards from P type silicon substrate 1, with base 11a constituting lower electrode 11 of capacitor 10 of memory cell array 101 thereunder. This double peripheral wall 20 is formed to enclose the region where memory cell array 101 is formed, as shown in FIG. 1. The potential of the periphery of memory cell array 101 can be fixed by adjusting the potential of base 11a of double periphery wall 20 to a predetermined potential.

Figure 3A:
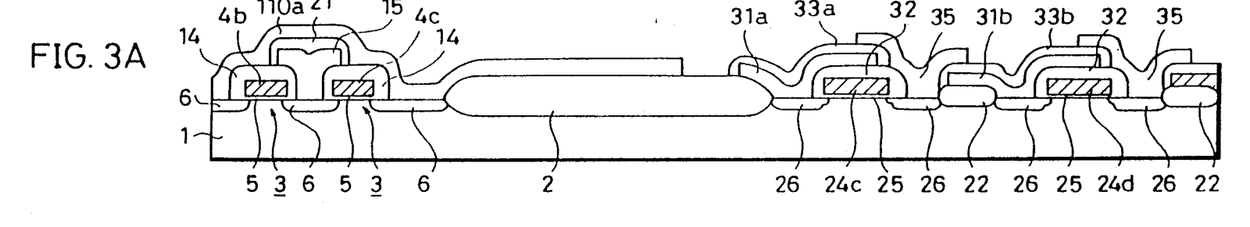
FIGS. 3A-3H are sectional views for explaining the method of manufacturing the DRAM of FIG. 2.
Figure 3B:
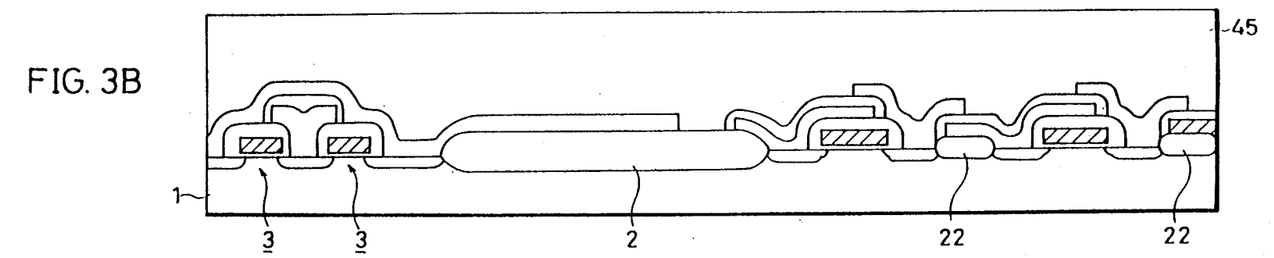
Figure 3C:
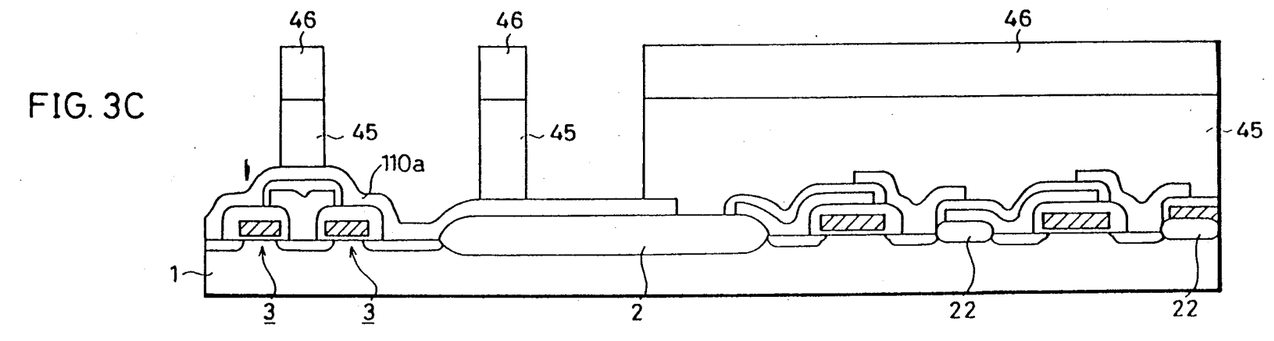
Figure 3D:
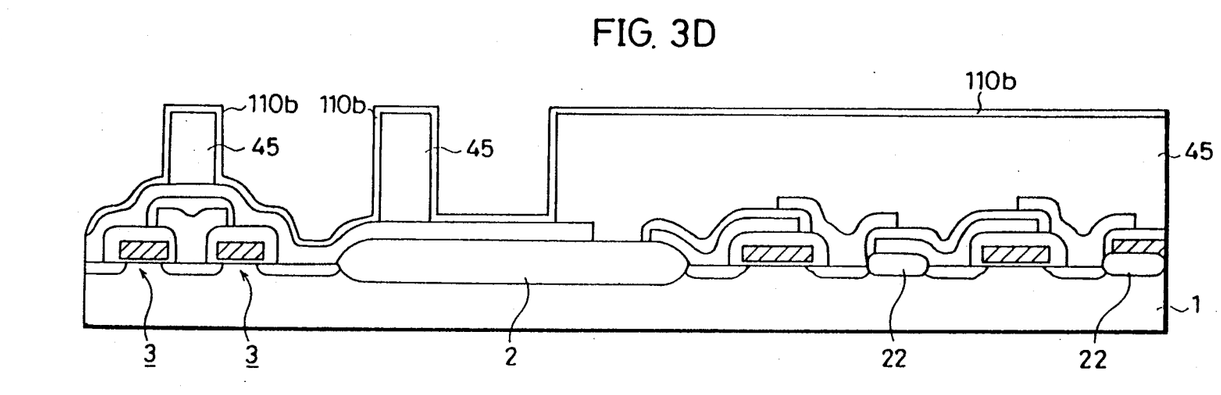
Figure 3E:
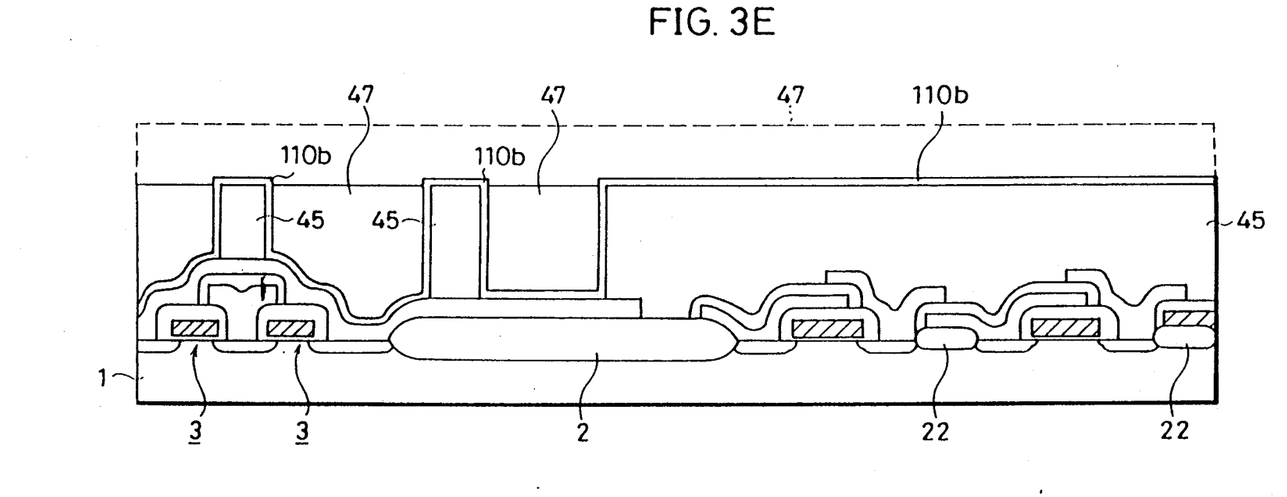
Figure 3F:
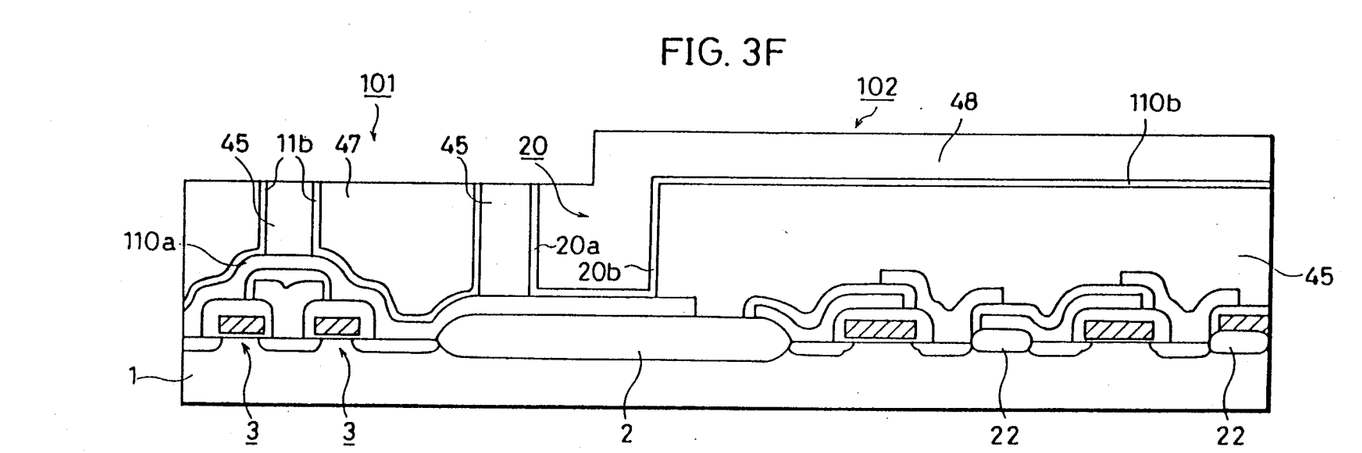
Figure 4:
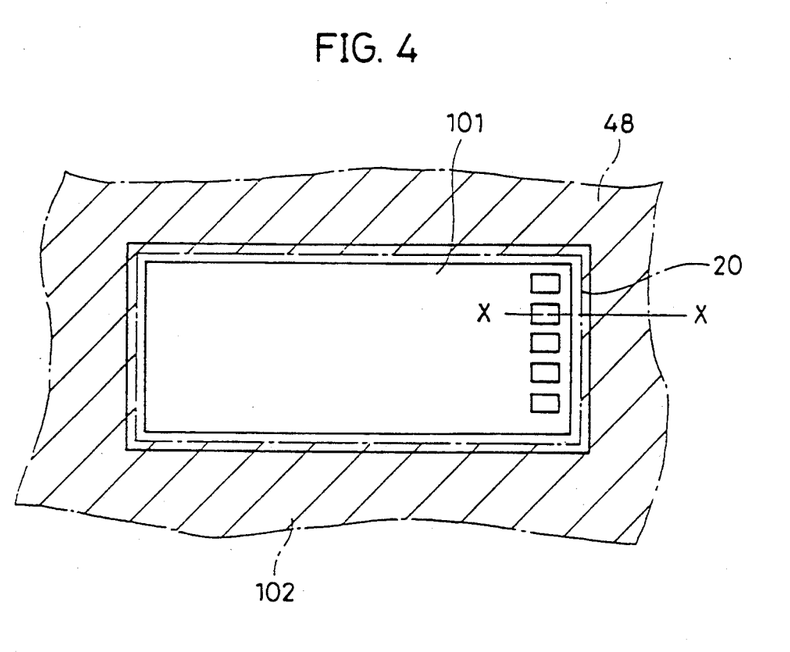
FIG. 4 is a plan view of the DRAM of FIG. 3F.

Referring to FIGS. 3A–4, the manufacturing process will be explained hereinafter. Field oxide films 2 and 22 are formed on P type silicon substrate 1. Then, source/drain regions 6 and gate electrodes 4b and 4c are formed implementing transfer gate transistor 3 of the memory cell array. Source/drain regions 26 and gate electrodes 24c and 24d are formed implementing two MOS transistors of the peripheral circuit. Bit line 15 is formed at source/drain regions 6 of the memory cell array. Simultaneously, conductive layers 31a and 31b are formed on source/drain regions 26 of the peripheral circuit. Insulating film 21, and insulating films 33a and 33b are formed on bit line 15, and conductive layers 31a and 31b, respectively. That is to say, a polycrystal silicon layer 110a having impurities introduced is deposited, and conductive layer 35 is formed in the peripheral circuit by patterning. Then, an oxide film 45 is formed on the whole surface, as shown in FIG. 3B. A resist 46 is formed over oxide film 45, as shown in FIG. 3C. Only the memory cell array region of the region where resist 46 is formed is patterned to carry out dry etching anisotropically. After resist 46 is removed, a polycrystal silicon layer 110b is formed on the whole surface, as shown in FIG. 3D. Then, an etch back film 47 is formed all over polycrystal silicon layer 110b, as shown in FIG. 3E. Etch back film 47 is etched-back to expose the top surface of polycrystal silicon layer 110b formed on the memory cell array. Oxide films and resists are used for etch back film 47. As shown in FIG. 3F, a resist 48 is formed all over the surface, with a stepped portion formed in the region between peripheral walls 20a and 20b of the double peripheral wall 20. The top surface of the exposed polycrystal silicon layer 110b of the memory cell array is selectively removed by etching. This step of FIG. 3F indicates that the region outside the center line of the double peripheral wall 20 formed at the boundary region of memory cell array 101 and peripheral circuit 102 is covered by resist 48, as shown in the plan view of FIG. 4. The sectional view taken along line X—X of FIG. 4 corresponds to FIG. 3F. The employment of this manufacturing process allows the removal of the top surface of polycrystal silicon layer 110b of memory cell array 101 under a state where polycrystal silicon layer 110b formed on peripheral circuit 102 still remains. That is to say, a stepped portion in resist 48 can be formed in the region between peripheral walls 20a and 20b, by providing peripheral walls 20a and 20b of the double peripheral wall 20. Thus, the problem that oxide film 45 is removed in the boundary region of memory cell array 101 and peripheral circuit 102 is solved in this embodiment. This problem could not be solved with the conventional proposed method of increasing the film thickness of the resist of peripheral circuit 102. In the present embodiment, the formation of steps in the boundary region of memory cell array 101 and peripheral circuit 102 can be effectively prevented, which was not possible before. Even in the case where a cylindrical stacked type capacitor is used for ensuring sufficient capacitor capacitance when the semiconductor device is integrated and miniaturized, the formation of steps in the boundary region of memory cell array 101 and peripheral circuit 102 can be prevented effectively. Thus, a semiconductor memory device suitable for larger scale integration can be provided. As a result of preventing the formation of steps, patterning accuracy can be improved at the boundary region of memory cell array 101 and peripheral circuit 102 after capacitor formation, and also prevent effectively the generation of etching residue in the etching step.

Figure 3G:
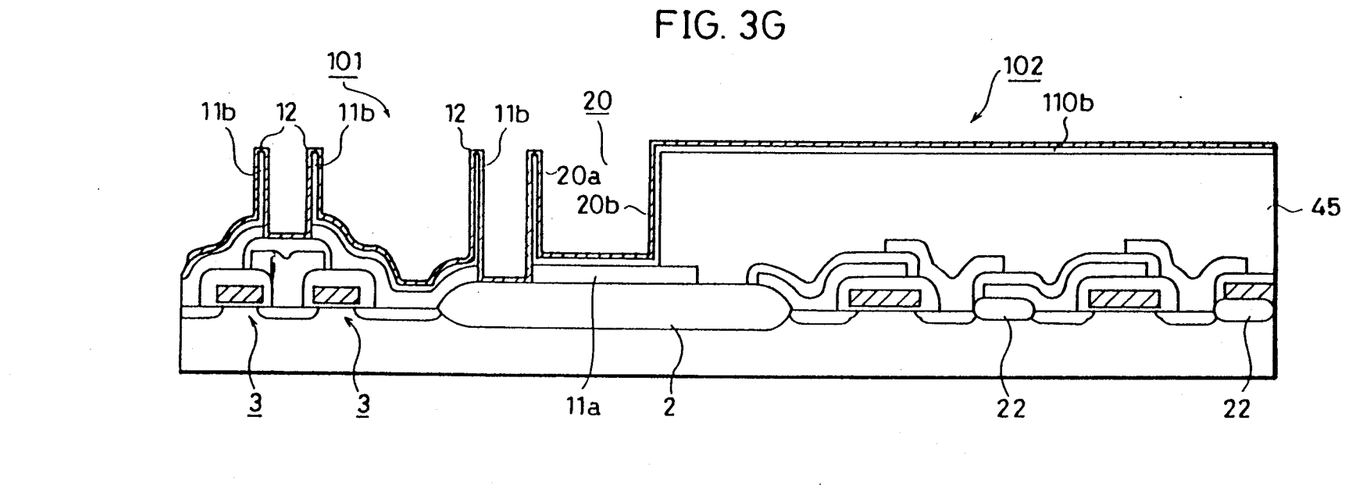
Figure 3H:
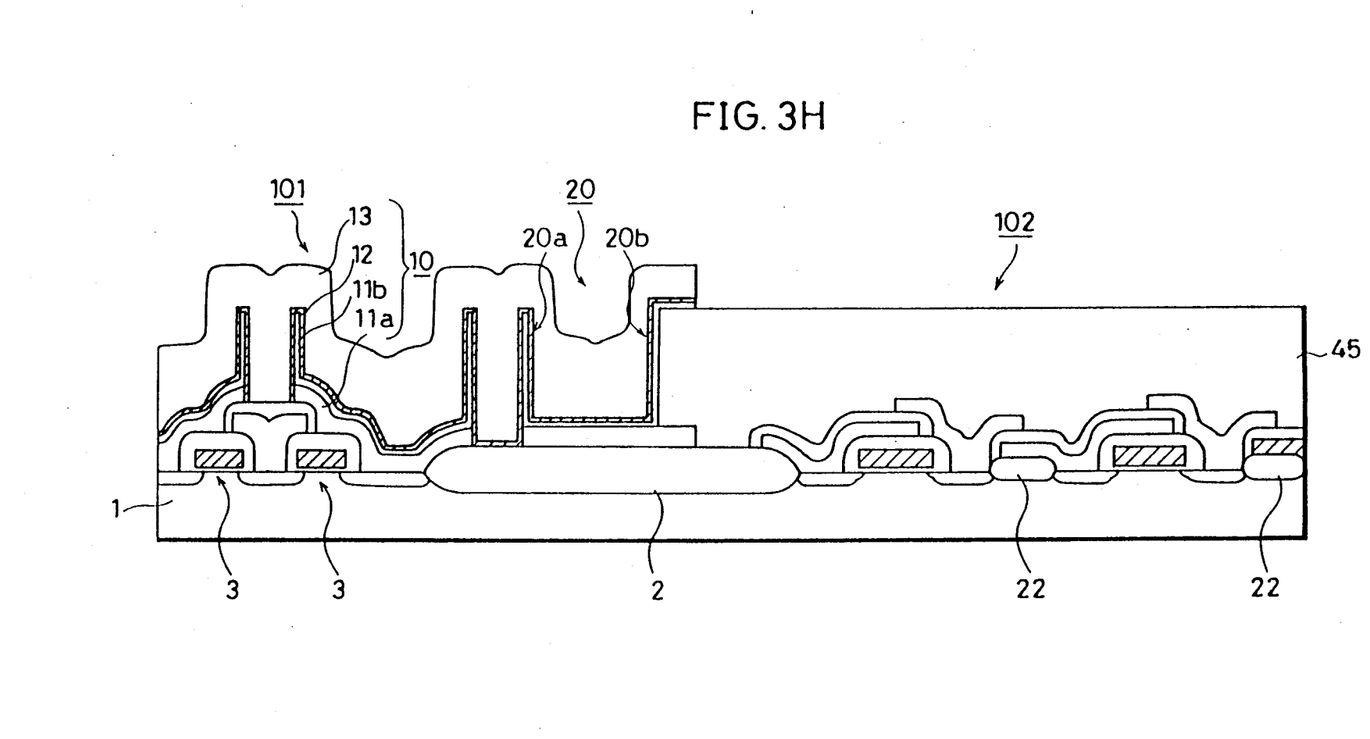

Next, oxide films 45 and 47 are removed, as shown in FIG. 3G. Polysilicon layer 110a (refer to FIG. 3F) is patterned in self-alignment to form base 11a. Resist 48 is then removed. As shown in FIG. 3H, a polycrystal silicon layer 13 is deposited, after dielectric layer 12 is formed on the whole surface. Then, other portions are removed to leave upper electrode 13 and dielectric film 12 only on the memory cell array by patterning. Thus, peripheral walls 20a and 20b are formed implementing the double layer peripheral wall 20. Also, capacitor 10 is formed implemented with base 11a and standing wall 11b of a polycrystal silicon layer, dielectric film 12, and an upper layer electrode 13 of polycrystal silicon layer. Interlayer insulating film 16 is deposited on the whole surface to form contact layer 36 of the peripheral circuit. Then, wiring layers 18 and 38 are formed in the corresponding portion. Thus, the DRAM 100 of FIG. 2 is formed.

Figure 5:
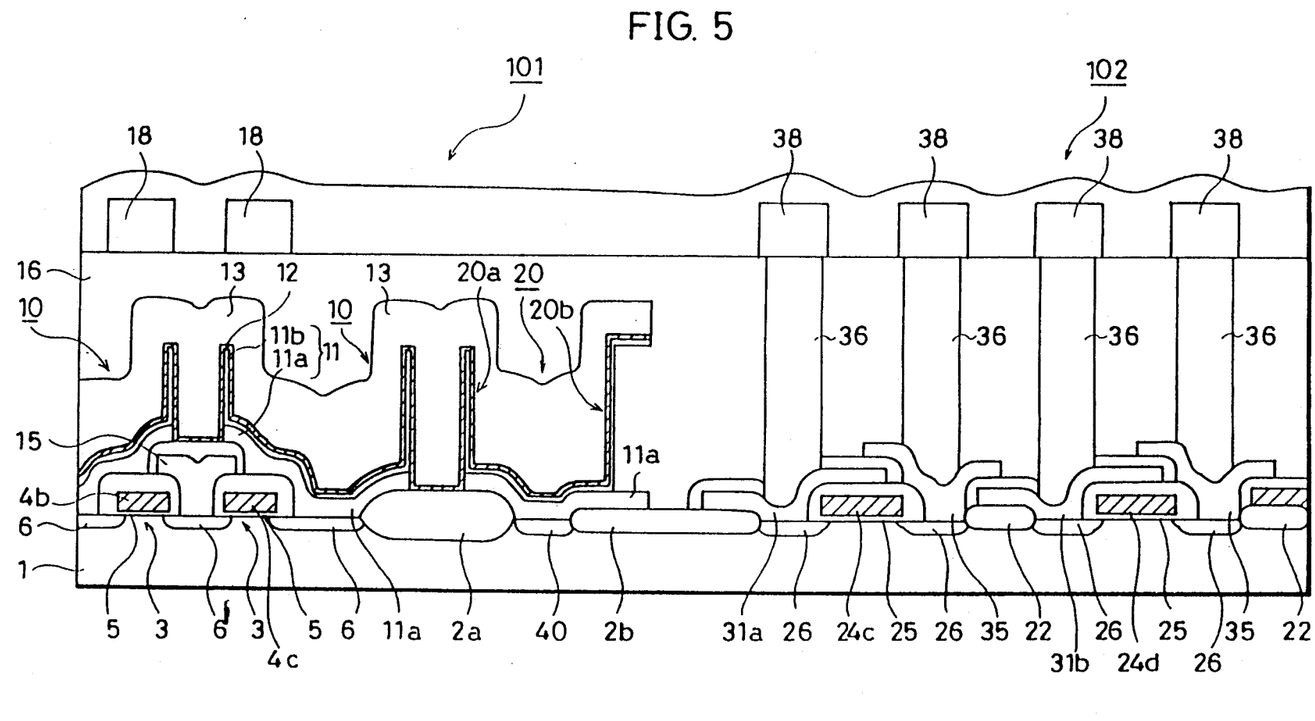
FIG. 5 is a sectional view of a DRAM of another embodiment of the present invention.

Referring to FIG. 5, this DRAM differs from that of FIG. 2 in that an impurity diffusion layer 40 is formed between field oxide films 2a and 2b formed on P type silicon substrate 1. There is also difference in that base 11a is formed to connect impurity diffusion layer 40, and that peripheral walls 20a and 20b constituting the double periphery wall 20 are formed above base 11a. Such a structure allows the achievement of fixing the potential of double peripheral wall 20 by adjusting the potential of impurity diffusion layer 40. As a result, the potential of the boundary region of memory cell array 101 and peripheral wall 102 can be fixed.

The semiconductor memory device in accordance with the present embodiment comprises a conductor having a pair of standing walls arranged opposing each other, extending in a vertical direction at the boundary region between the memory cell array and the peripheral wall. By forming the conductor so that the top surface of at least one of the standing wall is at a plane substantially identical with the top surface of one side wall of the capacitor, the upper surfaces of the devices formed on the memory cell array region and the peripheral circuit region are substantially planarized in forming devices on the memory cell array region and the peripheral circuit region, to prevent effectively the formation of steps at the boundary region of the memory cell array and the peripheral circuit region, even in case of high integration.

The method of manufacturing a semiconductor memory device of the present invention comprises the step of forming a first conductive film convexly on a first device forming region with an insulating film therebetween. A second conductive layer is formed on the second device forming region, wherein the upper surface is substantially the same as the convex upper surface portion of the first conductive layer. A pair of standing walls are formed with a predetermined distance therebetween along the boundary region of the first device forming region and the second device forming region, extending vertically upwards from the main surface of the semiconductor substrate, wherein the upper surface is substantially equal to the convex upper layer of the first conductive layer. An etch back film having a thick portion and a thin portion is formed all over the first device forming region and the second device forming region, with a stepped portion in the region between the pair of standing walls, so that the portion formed on the second device forming region is higher than the region formed on the first device forming region. The etch back film is etched back to expose the convex upper surface portion of the first conductive layer. By removing the convex upper surface portion of the first conductive layer under a state where the second conductive layer remains, the insulating film formed beneath the second conductive layer is not reduced in removing the convex upper layer of the first conductive layer. The formation of steps in the boundary region of the first device forming region and the second device forming region can be prevented effectively even if the semiconductor device is of high integration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a semiconductor substrate having at least one memory cell array region and a peripheral circuit region, said semiconductor substrate having an upper surface, comprising:

a plurality of memory cells formed on said memory cell array region on said semiconductor substrate, each said memory cell including a transistor having a pair of impurity regions formed at said upper surface of said semiconductor substrate and a gate electrode, and a capacitor connected to one impurity region of said transistor, said capacitor having a first electrode of generally U shaped cross section, said first electrode having a first bottom portion extending generally parallel to said upper surface of said semiconductor substrate and at least one projecting side portion extending substantially perpendicular to and above said first bottom portion so as to form the bottom and sides of generally U shaped cross section, and a second electrode insulated from said first electrode by a dielectric film, a plurality of transistors for peripheral circuits formed on the peripheral circuit region of said semiconductor substrate, and a conductor of generally U shaped cross section, said conductor having a first bottom portion extending generally parallel to said upper surface of said semiconductor substrate and at least one projecting side portion extending substantially perpendicular to and above said first bottom portion so as to form the bottom and sides of generally U shaped cross section, said conductor enclosing plural memory cells of said memory cell array region, wherein the end of said projecting side portion of said conductor most remote from said upper surface of said substrate is substantially coplanar with the end of said projecting side portion most remote from said upper surface of said substrate of said first electrode of said capacitor.

2. The semiconductor memory device according to claim 1, wherein said conductor is formed to enclose the periphery of said memory cell array region.

3. The semiconductor memory device according to claim 1, including a device isolation layer for isolating said memory cell array region from said peripheral circuit region, and wherein said conductor is formed above said device isolation layer.

4. The semiconductor memory device according to claim 1, including a device isolation layer for isolating said memory cell array region from said peripheral circuit region, and said device isolation layer further includes an impurity region therein, wherein said conductor is electrically connected to said impurity region.

5. The semiconductor memory device according to claim 4, wherein said conductor is connected electrically to said impurity region through a pad; and said pad is comprised of a material identical to the material forming said first electrode of said capacitor.

6. The semiconductor memory device according to claim 3, wherein said conductor is formed on said device isolation region separated by a pad; and said pad is comprised of a material identical to the material forming said first electrode of said capacitor.

7. The semiconductor memory device according to claim 1, wherein said at least one projecting side portion of said conductor has a further portion adjacent the end of said projecting side portion of said conductor remote from said upper surface of said substrate, said further portion extending from said at least one projecting side portion of said conductor generally parallel to said upper surface of said semiconductor substrate.

8. The semiconductor memory device according to claim 7, wherein said further portion and said projecting side portion of said conductor form the shape of an inverted "L", and said further portion projects toward said peripheral circuit region.

* * * * *